United States Patent [19]
Pathak et al.

[11] Patent Number: 5,781,469
[45] Date of Patent: Jul. 14, 1998

[54] BITLINE LOAD AND PRECHARGE STRUCTURE FOR AN SRAM MEMORY

[75] Inventors: Saroj Pathak, Los Altos Hills; James E. Payne, Boulder Creek, both of Calif.

[73] Assignee: Atmel Corporation, San Jose, Calif.

[21] Appl. No.: 788,523

[22] Filed: Jan. 24, 1997

[51] Int. Cl.$^6$ .................................................. G11C 7/00
[52] U.S. Cl. ........................... 365/156; 365/63; 365/72; 365/203; 365/190
[58] Field of Search ........................ 365/156, 154, 365/63, 72, 203, 204, 189.04, 230.03, 190

[56] References Cited

U.S. PATENT DOCUMENTS

| | | | |
|---|---|---|---|
| 4,467,456 | 8/1984 | Oritani | 365/203 |
| 4,802,129 | 1/1989 | Hoekstra et al. | 365/203 |
| 4,893,278 | 1/1990 | Ito | 365/203 |
| 4,907,200 | 3/1990 | Ikawa | 365/203 |
| 4,916,668 | 4/1990 | Matsui | 365/230.01 |
| 4,964,083 | 10/1990 | Nogle et al. | 365/189.11 |
| 4,972,373 | 11/1990 | Kim et al. | 365/203 |
| 5,140,533 | 8/1992 | Choi et al. | 365/203 |
| 5,301,157 | 4/1994 | Roberts | 365/203 |
| 5,343,082 | 8/1994 | Han et al. | 307/234 |
| 5,359,555 | 10/1994 | Salter, III | 365/203 |
| 5,416,744 | 5/1995 | Flannagan et al. | 365/203 |
| 5,418,748 | 5/1995 | Monden | 365/203 |
| 5,499,211 | 3/1996 | Kirihata et al. | 365/203 |
| 5,600,601 | 2/1997 | Murakami et al. | 365/203 |

*Primary Examiner*—Tan T. Nguyen
*Attorney, Agent, or Firm*—Thomas Schneck; Rosalio Haro

[57] ABSTRACT

An SRAM configures its bitline load structure to implement one of three different precharge schemes, none of which use an ATD circuit. The SRAM monitors its WRITE/READ pin and initiates a first precharging scheme when the SRAM is in a read mode. In the first precharging scheme, every complementary bitline pair is directly coupled to Vcc via a first pmos transistor which is permanently turned on, regardless of whether a memory cell is being read or not. Additionally, both true and false bitlines in every complementary bitline pair are coupled together via a pmos transistor as long as the SRAM remains in a read mode. When in a write mode, the second precharging scheme is initiated causing the second pmos transistor to be turned off and only the first pmos transistors remain active. Thus, all complementary bitline pairs which are not selected for a write operation are pulled up to Vcc by the first pmos transistors. The termination of the write mode activates the third precharging scheme which causes all the bitlines, both true and false, within the memory array to be momentarily shorted together. The cumulative equivalent capacitance of the complementary bitlines pairs which were not selected for a write operation help to pull up the few complementary bitlines pairs which were pull down during the previous write operation.

31 Claims, 5 Drawing Sheets

BITLINE LOAD AND PRECHARGE STRUCTURE FOR AN SRAM MEMORY

TECHNICAL FIELD

The invention relates to static random access memory architectures.

BACKGROUND ART

Figure 1:
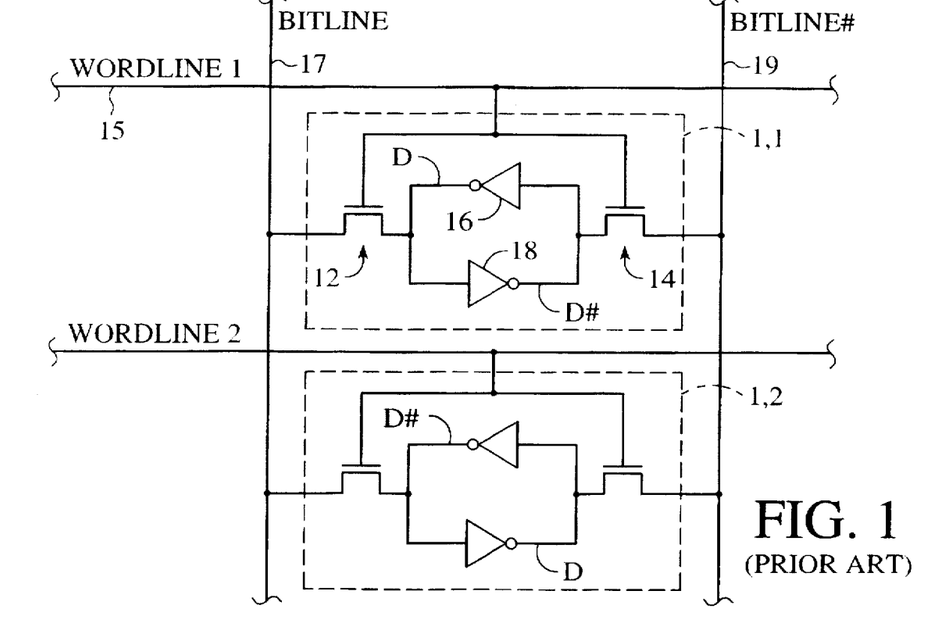
FIG. 1 is a partial view of a prior art memory array showing two SRAM cells of said memory array.

With reference to FIG. 1, SRAM memory cells 1,1 and 1,2 are part of a larger memory array, discussed below. As is typical in the art, each SRAM memory cell consists of two cross-coupled inverters 16 and 18 with the output of one inverter feeding into the input of the other inverter. Therefore, if inverter 16 has an output data D, then inverter 18 will have a complementary output data D#. The data stored by the two inverters is accessed by means of two pass transistors 12 and 14.

Each SRAM memory cell is addressed by means of one wordline and a pair of complementary bitlines. For example, cell 1,1 is selected by asserting wordline 15 which causes pass transistors 12 and 14 to access bitlines 17 and 19. Output data D from inverter 16 is transferred to bitline 17, and complementary output data D# from inverter 18 is transferred to complementary bitlines# 19.

Use of a complementary bitline pair, 17 and 19, for each column of memory cells is typical in the art and greatly speeds up the reading of a memory cell. For example, if only bitline 17 were available during the reading cell 1,1, then inverter 16 would have to drive bitline 17 from one logic level to another before its stored data could be determined. Since a memory array may be have a large number of rows of memory cells, bitline 17 may be very long and be coupled to a large number of memory cells and therefore have a large intrinsic capacitance. The large intrinsic capacitance of bitline 17 would slow down cell 1,1 and require a relatively long time to reach a desired logic level.

By using a pair of complementary bitlines to read an SRAM cell with each bitline receiving complimentary data, it is possible to ascertain the data stored in a memory cell by sensing a voltage difference between a pair of complementary bitlines instead of waiting for either bitline to receive the full stored logic level. This requires the use of a sense amp to read the voltage difference on both bitlines 17 and 19 and determine the stored data. Since a sense amp, not shown, reads a memory cell by discerning a voltage imbalance between a pair of bitlines, i.e. 17 and 19, it is not necessary for either inverter 16 or 18 to completely drive a bitline, 17 or 19, to a solid logic high or logic low and the read operation can thereby be cut short. For example, if bitline 17 is pulled to a higher voltage than complementary bitline 19, then cell 1,1 is determined to be storing a logic high. If bitline 17 is pulled to a lower voltage than complementary bitline 19, then cell 1,1 is determined to be storing a logic low. As long as enough of a voltage difference is placed on the complementary bitline pair 17 and 19, a sense amplifier will be able to discern the stored data without having to wait for a bitline to be pulled all the way up or down to a true logic level.

Use of a complementary bitline pair per column of memory cells, however, created a new problem in early SRAM memories. To illustrate, if memory cells 1,1 and 1,2 hold opposite data and are read consecutively, then memory cell 1,2 will have to change the direction of a preexisting voltage imbalance on bitlines 17 and 19 caused by the previous reading of cell 1,1. If complementary bitlines 17 and 19 are applied to a sense amp while cell 1,2 has not yet established a new voltage imbalance, then the sense amp may incorrectly read the preexisting voltage imbalance as the data stored in cell 1,2. Therefore, early SRAM memories having two bitlines per column of memory cells had to incorporate a certain amount of recovery time after every read operation to allow for a preexisting voltage imbalance to be changed by a newly selected memory cell before a complementary bitline pair could by accessed by a sense amp. This reduced the speed advantage that had been obtained by using a complementary bitline pair per column of memory cells.

The above problem was even more pronounced if a read operation followed a write operation. During a write operation, the complementary bitline pair of a column of memory cells must be strongly driven to a true high and a true low logic level in order to force the pair of cross coupled inverters in a memory cell to accept the new data being written and override any preexisting data. Therefore, a much greater voltage imbalance exists on a complementary bitline pair after a write operation then after a read operation, and thus a larger amount of recovery time was needed after a write operation than after a read operation.

In addressing this time recovery problem, it was previously noted that a recovery time is needed only when switching from one row of memory cells to another, that is, when changing from one selected wordline to another. As a result, one typical way of resolving the above described time recovery problem is to determine when a new wordline is to be selected, and to take some read preparatory steps before the new wordline is actually selected. The preparatory steps included precharging each complementary bitline pair to a common high voltage and clamping together both bitlines in each complementary bitline pair to limit the maximum voltage imbalance. This eliminated any low voltage that may have required a cell a long time to raise and also reduced the voltage difference on both bitlines so that a sense amp would not discern any preexisting data.

Figure 2:
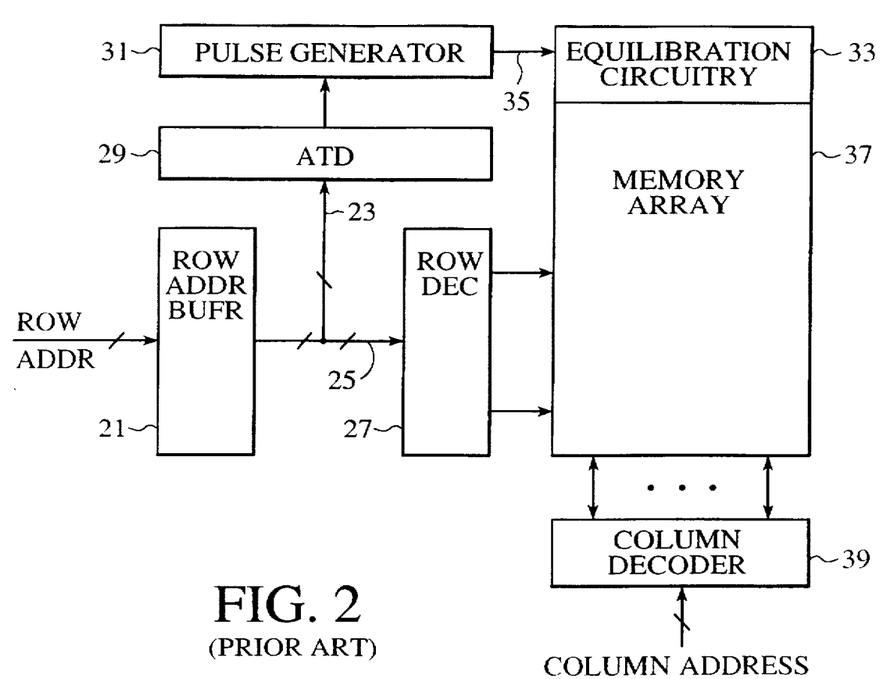
FIG. 2 is functional block diagram of a prior art SRAM architecture using ATD circuitry.

With reference to FIG. 2, a typical architecture for implementing the preparatory steps discussed above begins by latching input row address leads, which select a wordline, into a row address buffer 21. The row address buffer 21 then transmits the row address along two address buses 25 and 23 to a row decoder 27 and an address transition detection circuit, ATD, 29, respectively. Row decoder 27 selects one wordline in memory array 37, and a column decoder 39 selects one complementary bitline pair in memory array 37. The ATD circuit 29 detects when a row address bus line changes, meaning that a new wordline is to be selected by the row decoder 27, and responds by generating a pulse signal to a pulse generator 31. The pulse generator then creates an output pulse signal 35 of predetermined duration which activates an equilibration circuit 33. The duration of the equilibration action is determined by the pulse signal 35 from the pulse generator 31, but must be terminated before the row decoder 27 activates the newly selected wordline. U.S. Pat. No. 4,916,668 to Matsui describes a pulse generator with an output pulse signal having a longer duration after a write operation than after a read operation. Equalization circuit 33 applies a precharge voltage pulse to all bitlines in memory array 37 while simultaneously clamping together both bitlines in each complementary bitline pair, as described above.

Figure 3:
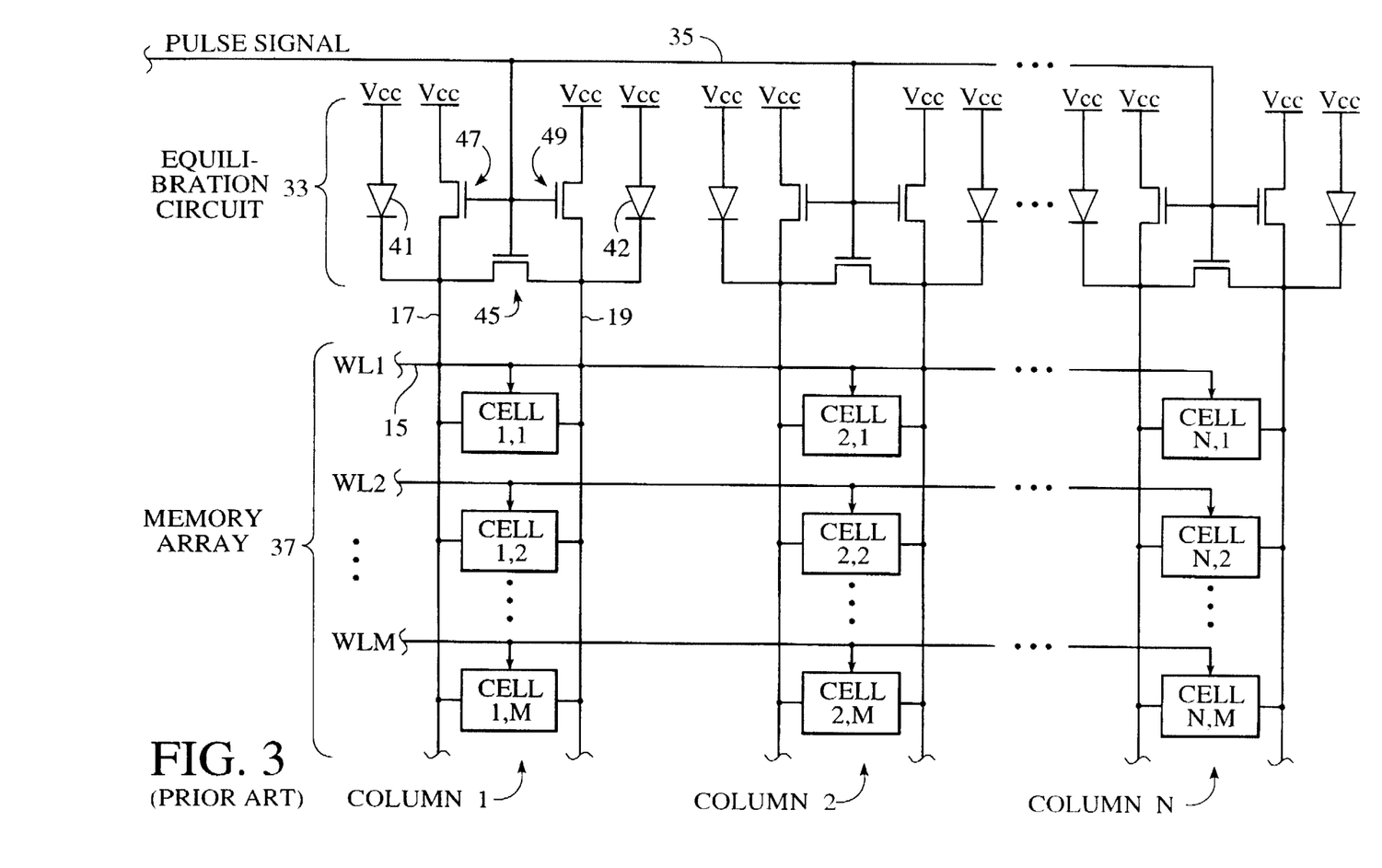
FIG. 3 is a transistor level implementation of a prior art equilibration circuit coupled to an SRAM memory array.

With reference to FIG. 3, a typical equilibration circuit 33 is located above memory array 37. Each complementary bitline pair, for example bitlines 17 and 19, are selectively coupled to Vcc by means of a bitline load structure in equilibration circuit 33. All complementary bitline pairs have identical bitline load structures, and in the example of complementary bitline pair 17 and 19, the bitline load structure consists of a first diode 41 connecting bitline 17 to Vcc, a second diode 42 connecting bitline 19 to Vcc, a pair of switch transistors 47 and 49 selectively coupling bitlines 17 and 19 to Vcc, and an equalization transistor 45 selectively coupling together bitlines 17 and 19. Diodes 41 and 42 will activate only if the potential on their respective bitlines 17 or 19 drops below their threshold voltage. In this manner, diodes 41 and 42 limit the voltage drop on a bitline during a read operation to not more than one diode threshold voltage below Vcc. By limiting the voltage imbalance as well as the maximum allowed low voltage on a complementary bitlines pair during a read operation, equilibration circuit 33 can more quickly raise the voltage potential on a bitline to values close to Vcc. It is to be understood that during a write operation, one of bitlines 17 or 19 is driven low substantially strong enough to overcome the limiting operation of diodes 41 and 42.

Switch transistors 47 and 49 and equalization transistor 45 are controlled by pulse signal 35, which has a pulse length determined by the pulse generator 31 of FIG. 2. In FIG. 3, before a wordline activates and a memory cell is selected, pulse signal 35 momentarily activates transistors 45–49 in each column of memory cells. Switch transistors 47 and 49 will help couple bitlines 17 and 19, respectively, to Vcc and thereby augment the driving strength of diode 41 and 42 to more quickly pull up a bitline. This is especially beneficial after a write operation since either bitline 17 or 19 will be at a strong low logic voltage and transistors 47 and 49 can now work in conjunction with diodes 41 and 42 to more quickly raise its voltage level up toward Vcc.

N-type equalization transistor 45 couples complementary bitline pair 17 and 19 together to ensure that their voltage imbalance is within a predetermined value before a memory cell is selected. Since both bitlines 17 and 19 are raised to a high voltage, n-type transistor 45 will clamp their voltage imbalance to one transistor threshold voltage. Thus all the bitlines are brought to a high and similar voltage value before a new memory cell is selected. In this manner, a newly selected memory cell will not require a recovery time to drive a preexisting voltage imbalance and thereby speed up its read operation. Similar equilibration circuitry is disclosed in U.S. Pat. No. 4,916,668 to Matsui and U.S. Pat. No. 5,418,748 to Monden.

Figure 4:
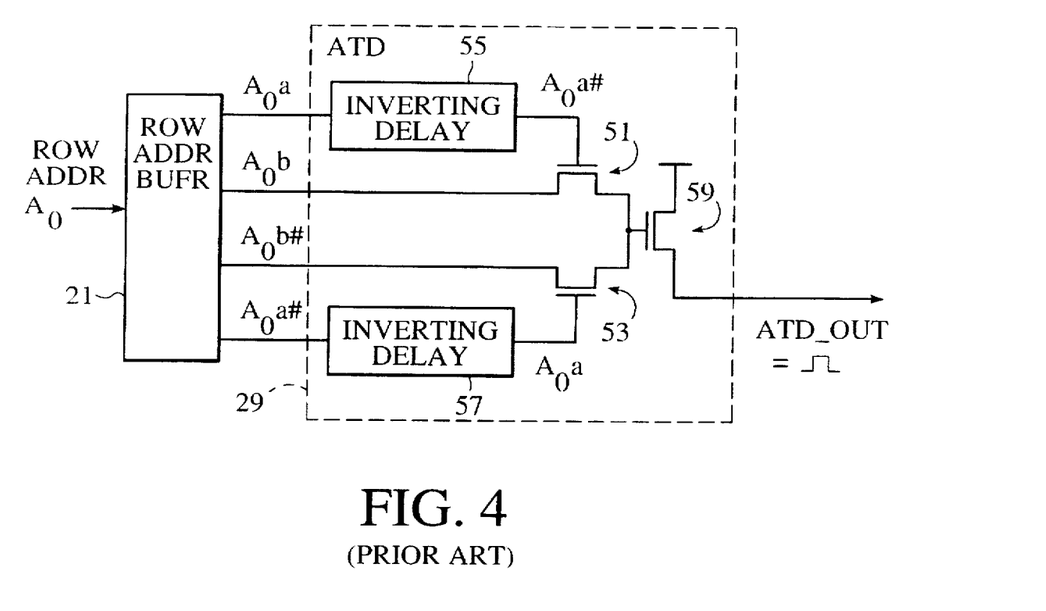
FIG. 4 is a first implementation of a prior art ATD circuit.

Each lead in row address bus 23 in FIG. 2 is monitored by an individual ATD circuit 29. With reference to FIG. 4, for illustrative purposes an early ATD circuit 29 is shown monitoring a single row address, A0. ATD 29 requires two complementary copies of row address lead A0. Row address buffer 21 customarily generates a true, A0$a$, and complementary, A0$a$#, copy of an input row address lead A0, but use of ATD 19 requires an additional second complementary copy A0$b$ and A0$b$# of the same row address lead A0. The first address copy A0$a$ and A0$a$# pass though an inverting delay 55 and 57, respectively, before reaching the control gate of respective pass transistors 51 and 53. The second address copy A0$b$ and A0$b$# are applied directly to the source electrodes of respective pass devices 51 and 53. Therefore, after signals A0$a$ and A0$a$# have reached transistors 51 and 53, each pass transistor 51 and 53 will always have a logic value at its control gate opposite its source electrode. In other words, after both delays 58 and 57 have elapsed, only one of pass transistors 51 or 53 will be actuated, i.e. have a logic high on its control gate, and the actuated pass transistor 57 or 58 will necessarily have a logic low at its source electrode which it couples to the control gate of transistor 59.

Transistor 59 is therefore normally off, except for a period after a row address lead changes and signals A0$a$ and A0$a$# have not yet propagated through their respective delays 58 and 57. If row address line A0 changes, the second copy of the new address, A0$b$ and A0$b$#, will reach the source electrodes of their respective pass transistor 51 or 53 before the change appears at the control gates of pass transistors 51 and 53. Therefore, the pass transistor, 51 or 53, which previous had a logic high on its control gate and was in an "ON" state will momentarily also have a logic high at its source electrode. This will momentarily transfer a logic high to transistor 59 until new signals A0$a$ and A0$a$# propagate through inverting delays 58 and 57. During this delay period, transistor 59 will output a high ATD_OUT signal indicating an address change A0 to a pulse generator 31.

Since every address lead requires two complementary copies of itself and a separate address transition detection ("ATD") circuit, this basic ATD circuit increased the bus size and real estate requirements considerably, increased the ATD circuit's susceptibility to noise error and the addition of two inverting delays per ATD circuit complicated its operation.

Figure 5:
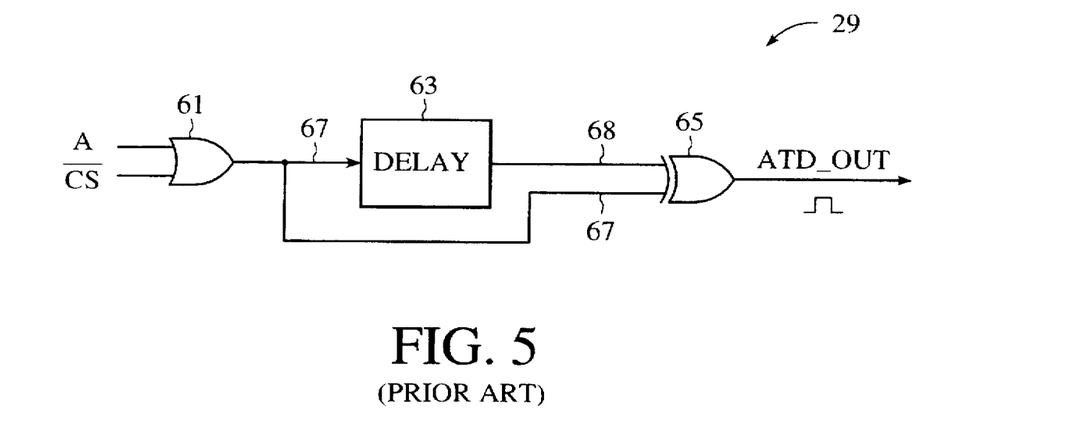
FIG. 5 is a second implementation of a prior art ATD circuit.

With reference to FIG. 5, attempts to improve the basic ATD circuit resulted in a simplified and more conventional ATD circuit 29 which reduces the number of additional address bus lines and requires only one delay element 63. OR gate 61 activates the ATD circuit only when the IC is selected, as determined by chip select lead CS. ATD 29 monitors one address line, A, which it applies to a delay 63 and to an exclusive OR gate 65 along lead 67. The output of the delay 63 is also applied to exclusive OR gate 65 along lead 68. When both leads 68 and 67 have the same logic value, i.e. after a signal A has propagated through delay 63, exclusive OR gate 65 will output a low signal. When leads 68 and 67 have different logic values, i.e. after a change in A but before the change has propagated through delay 63, exclusive OR gate 65 will output a logic high. Therefore, if signal A changes, lead 67 and 68 will momentarily have opposite logic values until the new signal A propagate through delay 63. During this delay period, exclusive Or gate 65 will output a logic high pulse and signal the change of a wordline address lead to a pulse generator 31.

This circuit reduces the complexity of the circuit of FIG. 4, but still requires substantial added circuitry due to the increased bus width, pulse generator 31, equilibration circuit 33 and one delay element per row address line. Although the trade-off of improved performance for increased real estate and complexity of implementing ATD circuitry has traditionally been acceptable, recent advances in device miniaturization have resulted in improved speed gains. Because of the improved speed gains, the wisdom of using ATD circuitry has come into question. The increased speed gains of current SRAM memories in addition to the complexities in implementing ATD circuitry have increased noise errors to the point where ATD circuits are fast becoming a major reliability issue.

That is, the use of delay elements and wider bus lines in ATD circuits makes them more susceptible to noise problems, especially at today's higher speeds. If any row address lead experiences a noise spike, it may unintentionally trigger an ATD circuit causing it to erroneously signal an address change and submit the memory array to a sporadic equilibration operation. Since the memory array may not have been properly prepared for the equilibration operation or may actually be in the middle of a read operation when the sporadic equilibration operation occurs, the memory array may likely experience loss of data. Some steps to further modify the conventional ATD circuit to improve its noise immunity have been proposed, such as disclosed in U.S. Pat. No. 5,343,082 to Han et al.

Other attempts toward reducing the ATD noise problem have been to eliminate the ATD circuit altogether. U.S. Pat. No. 4,964,083 to Nogle et al. subdivides an SRAM memory array into smaller blocks with shorter and fewer bitlines which can be quickly charged and discharged without the aid of an ATD circuit. But this complicates the memory array, complicates the address decoding circuitry and requires additional complex circuitry such as supplemental differential amplifiers and transconductance amplifiers to ensure a fast read operation.

Another approach toward eliminating the use of an ATD circuit is to use a much more complicated equilibration circuit which constantly monitors each complementary bitline pair in a memory array when the SRAM is in a read mode. The new equilibration circuit activates its pull-up bitline load structure when the voltage imbalance on a complementary bitline pair goes beyond some predetermined value. The new equilibration circuit is deactivated during a write operation or can be signaled to function as a driving circuit during a write operation, as taught in U.S. Pat. No. 5,416,744 to Flannagan et al.

It is an object of this invention to provide an SRAM with improved noise immunity.

It is another object of this invention to provide an SRAM with improved use of available chip space.

It is another object of this invention to provide an SRAM which does not use an ATD circuit for fast operation and which does not have a complex bitline load structure.

SUMMARY OF THE INVENTION

The above objects have been met in an SRAM which monitors a single write/read pin to determine its mode of operation instead of monitoring multiple address pins, and therefore does not require address transition detection circuitry. The bitline charging scheme of the present invention has three modes of operation. When the SRAM is in a read mode, the precharging scheme is in first mode of operation and the bitline load structure associated with each complementary bitline pair assumes a first, fixed configuration of three transistors, regardless of the voltage on the bitline pairs. When the SRAM is in a write mode, the precharging scheme enters its second mode of operation and the bitline load structure associated with each complementary bitline pair assumes a second, fixed configuration of two transistors, regardless of the voltage on the bitlines. Therefore, the bitline load structure of the present invention does not require circuitry to monitor the voltage condition of the complementary bitlines. Immediately following the end of a write mode, the SRAM defaults to its read mode and the bitline load structure of each complementary bitline pair re-establishes its first, fixed three transistor configuration. Additionally, a post-write pulse signal is generated in response to the end of the write mode during which the memory array configuration is altered for the duration of the post-write pulse. The combination of the read mode bitline load structure and the momentary alteration of the memory array constitutes the third mode of operation of the charging scheme of the present invention.

When the SRAM is in read mode, the first bitline precharging scheme is actuated in response to a read mode signal from the write/read pin of the SRAM. Each first and second bitline in every complementary bitline pair is coupled to Vcc by means of a respective first and second p-type transistor. The first and second p-type transistors have their control gates directly connected to ground and are thus in a permanent "ON" state regardless of the SRAM's mode of operation. But each first and second bitline in every complementary bitline pair further has a third p-type transistor which selectively couples together both first and second bitlines in response to the read mode signal.

Thus, when the SRAM is in a read mode, the bitline load structure of each complementary bitline pair assumes a fixed three transistor structure. A first and second transistor permanently couple each bitline in a complementary bitline pair to Vcc and a third p-type transistor, responsive to the read mode signal, couples together both bitlines as long as the SRAM is in a read mode regardless of the whether a read operation is in progress or not. The third p-type transistor maintains both bitlines in each complementary bitline pair in continual electrical communication, but is small enough so that a selected memory cell can still establish a voltage imbalance on a complementary bitline pair.

When the SRAM is in write mode, as determined by the write/read pin, the read mode signal is removed causing the third p-type transistor to turn "OFF" and decouple both bitlines in every complementary bitline pair. Thus, during a write mode of operation, the bitline load structure consists of only the first and second transistors, which are always "ON" and always couple every bitline to Vcc. Because the first and second p-type transistors are "ON" whenever the SRAM is activated regardless of whether the SRAM is in a read mode or write mode, it is made smaller than conventional pull-up p-type bitline load transistors in the prior art. The size of the first and second p-type transistors are such that they are small enough so that a cell can pull down a bitline and establish a voltage imbalance during a read operation, but big enough that they can quickly pull up a bitline for high speed read performance after a cell has released the bitlines. After a write operation, however, one of the bitlines in multiple complementary bitline pairs is at a strong low logic level, and the first and second transistors would require a relatively long time to pull-up the low bitline if they acted alone. Therefore, the SRAM of the present invention incorporates a third precharging scheme.

The end of a write mode signals the beginning of a read mode and also initiates the third precharging scheme. In addition to the first through third transistors discussed above in regards to the first precharging scheme, the present invention includes an additional transistor per complementary bitline pair which alters the configuration of the memory array. Typically, the complementary bitline pairs defining each column of memory cells are autonomous and isolated from one another, but in the present invention a fourth transistor selectively couples one column of memory cells to an adjacent column of memory cells. Each column of memory cells is defined by a complementary bitline pair consisting of a true bitline and a false bitline, which carries the complementary logic of the true bitline when a cell is selected. Adjacent complementary bitline pairs have the false bitline from a first column of memory cells selectively coupled to the true bitline from the adjacent column of memory cells by means of the fourth transistor.

A post-write pulse is generated in response to the end of the write mode, or stated differently, in response to the beginning of the read mode. The fourth transistor is responsive to this post-write signal and couples one column of memory cells to an adjacent column of memory cells for the duration of the post-write pulse. Since the SRAM will have entered its read mode, both true and false bitlines in each pair of complementary bitlines will also be coupled to each other by means of previously discussed third transistor. As a result, all the individual bitlines in the memory array will be shorted together for the duration of the post-write pulse.

As explained above, immediately ending a write mode, some bitlines may have a strong low potential resulting from the previous write operation, but the vast majority of bitlines will have retained their high voltage potential. Associated with every bitline is an intrinsic capacitance with some amount of stored charge. Normally, it is the intrinsic capacitance of a bitline which slows down the precharge phase following a write operation, but the present invention uses the intrinsic capacitance of the bitlines to speed up the precharge phase. Since most of the bitlines will have a high voltage following a write operation and all the bitlines are coupled together during the post-write signal, the intrinsic capacitance of each bitline is added together to form a large cumulative equivalent capacitor storing a large charge. When the large cumulative capacitor having a large stored charge is coupled to the relatively few bitlines having a low voltage potential, the large cumulative capacitor greatly augments and boosts the current driving capability of the first and second transistors, which always couple a bitline to Vcc and quickly charge up all low bitlines before a read operation begins.

BEST MODE OF CARRYING OUT THE INVENTION

Figure 6:
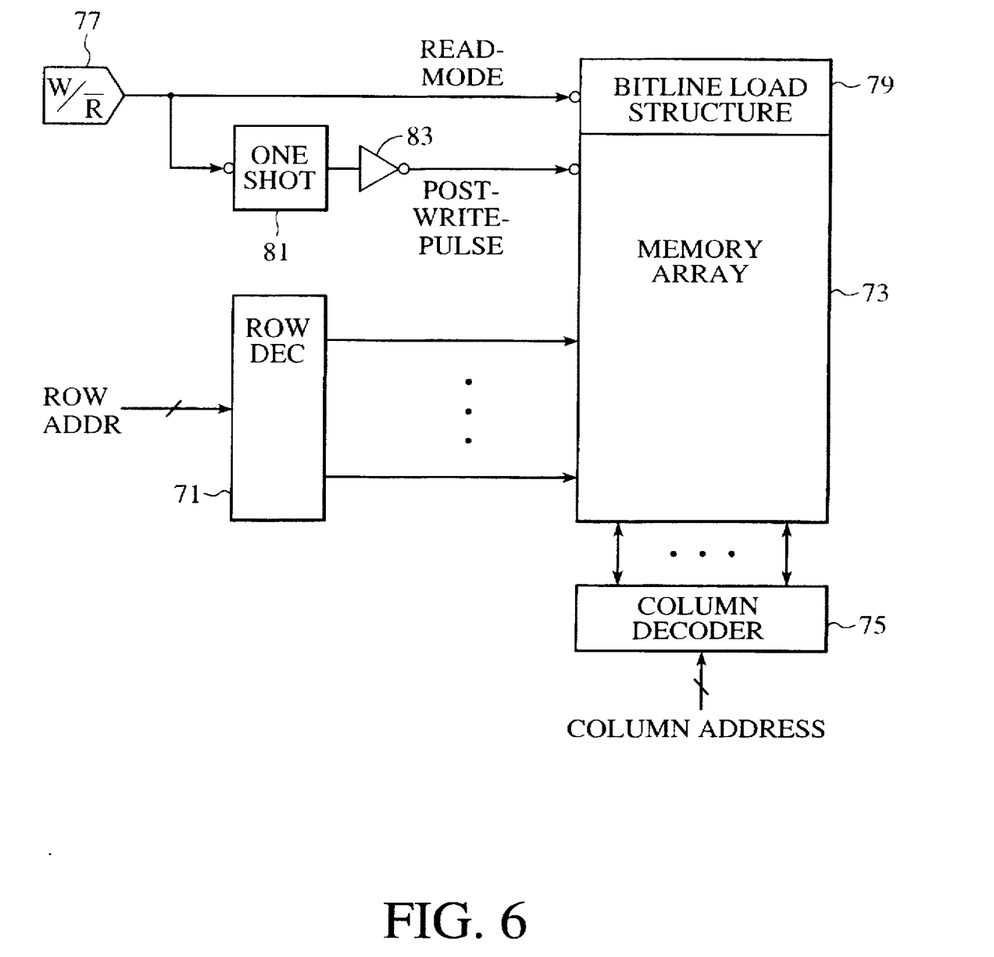
FIG. 6 is a functional block diagram of an SRAM architecture in accord with the present invention.

With reference to FIG. 6, a memory array 73 in accord with the present invention receives a decoded wordline from a row decoder 71 and a decoder complementary bitline pair from a column decoder 75. The SRAM of the present invention does not monitor the row address lines or column address lines. Instead, a bitline load structure 79 maintains each complementary bitline pair in memory array 73 at a proper precharge level when in a read mode and precharges the complementary bitlines pairs after a write operation by initiating one of three precharging schemes.

Bitline load structure 79 determines when the SRAM is in a read mode or in a write mode by, for example, directly or indirectly monitoring a write/read pin 77. A signal on write/read pin 77 places the SRAM in a write mode and low signal on write/read pin 77 places the SRAM in a read mode.

In the preferred mode of FIG. 6, bitline load structure 79 directly monitors write/read pin 77. In the present implementation, bitline load structure 79 has an active low architecture and therefore responds to a low signal on a read-mode line from write/read pin 77 by initiating the first precharge scheme. The first precharging scheme configures a read-mode, bitline load structure for each complementary bitline pair in memory array 73.

When write/read pin 77 receives a high voltage, indicating a write mode, bitline line load structure 79 initiates a second precharge scheme and configures a write-mode, bitline load structure for each complementary bitline pair in memory array 73. In either read or write mode, the first and second precharge schemes remain unchanged regardless of whether an actual read or write operation is in progress or not. In other words, the read-mode bitline structure and the write-mode bitline structure are fixed and unchanging as long as the SRAM remains in its respective read or write mode.

Write/read pin 77 is also applied to an active low one shot circuit 81. One shot circuit 81 will output a high pulse of predetermined duration in response to write/read pin 77 receiving a low signal. A low signal on write/read pin 77 indicates both the end of a write mode and the beginning of a read mode. Thus one shot circuit 81 outputs a high pulse to signal the end of the write mode to bitline load structure 79. Since, as stated earlier, bitline load structure 79 of the preferred embodiment has active low inputs, the output from one shot 81 is passed through an inverter 83 before being applied to bitline load structure 79. Thus, inverter 83 normally has a high output signal, but outputs a low pulse in response to one shot circuit 81 and triggers the third precharging and duration of the low pulse.

The third precharging scheme alters the configuration of memory array 73 and also builds on the first precharging scheme. Since the third precharging scheme is initiated in response to the high-to-low transition of write/read pin 77, the SRAM is in read mode during the third precharging scheme and the first precharging scheme is likewise initiated. Since the first precharging scheme is fixed and non-changing, both the first and third precharging schemes overlap for the duration of the low pulse until the third precharging scheme is removed and only the first precharging scheme remains. The combination of the first and third precharging schemes acting simultaneously has the effect of shorting together every bitline within memory array 73. The internal structure of bitline load structure 79, and its relationship with memory array 73 are better depicted in FIG. 7.

Figure 7:
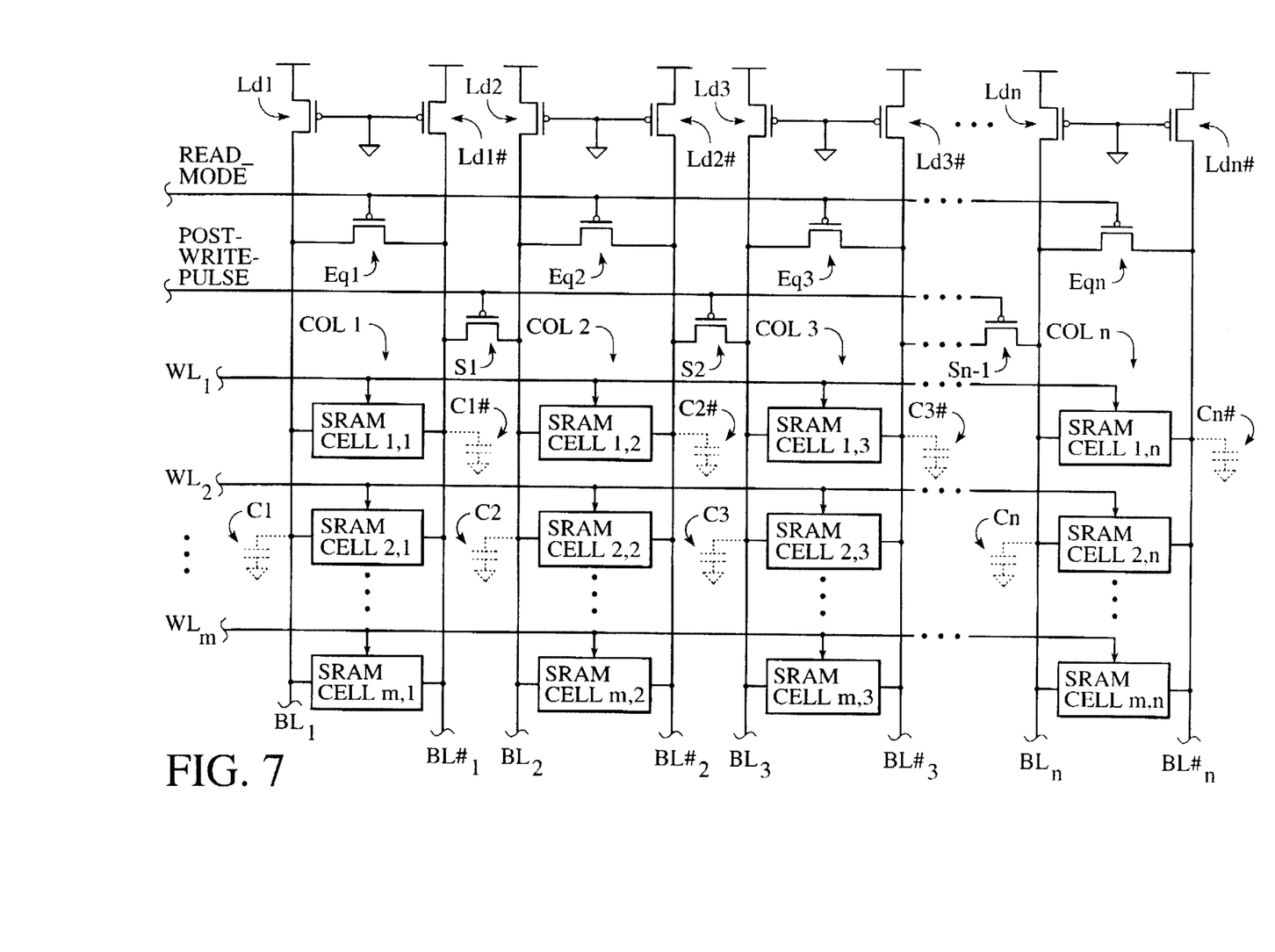
FIG. 7 is a transistor level implementation of a bitline load structure and SRAM memory array in accord with the present invention.

With reference to FIG. 7, the memory array of the preferred embodiment consists of m rows and n columns addressing (m)×(n) SRAM cells. Each SRAM cell is addressed by selecting the appropriate wordline $WL_1$–$WL_m$ and column col__1–col__n. Each column col__1–col__n is respectively defined by a complementary bitline pair, $BL_1$/$BL\#_1$ to $BL_n$/$BL\#_n$. Each bitline has an intrinsic capacitance such that each complementary bitline pair $BL_1$/$BL\#_1$ to $BL_n$/$BL\#_n$ has a respective intrinsic capacitive pair C1/C1# to Cn/Cn#. Each complementary bitline pair has a similar bitline load structure configured by the read-mode line and the post-write pulse line.

For illustrative purposes, the configuration of the bitline load structure in accord with the present invention is explained in reference to col__1. Each bitline $BL_1$ and its complement $BL\#_1$ is directly coupled to Vcc by means of a load transistor, Ld1 and Ld1#, respectively. In the preferred embodiment both Ld1 and Ld1# are p-type transistors and therefore have their respective control gates grounded. An equalization transistor Eq1 responsive to the read-mode line couples one bitline $BL_1$ to its complementary bitline $BL\#_1$. A fourth transistor switch, $S_1$, responsive to the post-write pulse selectively couples two adjacent columns, i.e. col__1 and col__2, by connecting together their respective adjacent bitlines, $BL\#_1$ and $BL_2$.

When the read-mode line has a low voltage and the post-write pulse line has a high voltage, meaning that the SRAM is in a read mode and has not just terminated a write operation, transistor Eq1 is ON and transistor $S_1$ is OFF. If no SRAM memory cell is selected for a read operation and thus no memory cell is coupled to $BL_1$ or $BL\#_1$, load transistors Ld1 and Ld1# will pull up both $BL_1$ and $BL\#_1$ to Vcc and Eq1 will help maintain both $BL_1$ and $BL\#_1$ at equal potentials. If, on the other hand, a wordline such as $WL_1$ is activated and SRAM cell 1,1 is thereby selected, SRAM cell 1,1 will begin placing a voltage imbalance on $BL_1$ and $BL\#_1$. Load transistors Ld1 and Ld1#, will oppose the pulling down of a bitline and thus prevent SRAM cell 1,1 from pulling a bitline much below Vcc. Additionally, Eq1 is also active and couples $BL_1$ to $BL\#_1$ and also prevents SRAM cell 1,1 from pulling a bitline much below Vcc or placing too large of a voltage imbalance on the complementary bitlines. Eq1 is relatively small since it is always ON, unlike the prior art which conventionally uses a voltage clamping means in between a complementary bitline pair which activates only when a the voltage imbalance reaches a predetermined value.

Load transistors Ld1 and Ld1# are likewise always active, but must still allow a memory cell to slightly pull low a bitline. Therefore, Ld1 and Ld1# are likewise smaller than in conventional SRAMs and are sized such that an SRAM cell can place a voltage imbalance on a complementary bitline pair, but Ld1 and Ld1# are still large enough to quickly pull up a bitline to Vcc after a read operation and prior to a another wordline being decoded and selected. Thus, load transistors Ld1 and Ld1# maintain bitlines $BL_1$ and $BL\#_1$ at a relatively high voltage in between and during read operations.

Unlike the prior art, transistor Eq1 does not act as a voltage clamp which activates only when the voltage imbalance on $BL_1$ and $BL\#_1$ reaches a predetermined voltage imbalance. Rather, because $BL_1$ and $BL\#_1$ are maintained at a relatively high voltage during a read mode and because Eq1 is a p-type transistor, which can pass a high voltage without attenuation, transistor Eq1 is always active and maintains both bitlines $BL_1$ and $BL\#_1$ in constant electrical communication during a read mode.

When a write operation is initiated, both the read-mode line and the post-write pulse line receive a high signal and both transistors Eq1 and $S_1$ are deactivated. Load transistors Ld1 and Ld1# remain active and maintain bitline $BL_1$ and $BL\#_1$ at a high potential until a write drive circuit, not shown, pulls down one of the bitlines. Selection of one of the wordlines $WL_1-WL_m$ addresses a row of memory cells and application of the write drive circuit to a few selected columns of complementary bitline pairs forces the selected SRAM cells to accept the new data being written in. As explained above, this requires that one of the bitlines in each selected complementary bitline pair be pull down relatively closed to ground.

Once the new data has been written in the selected SRAM cells and the write drive circuitry is removed from the memory array, the pull-up load transistors Ld1/Ld1# to Ldn/Ldn# of the selected complementary bitline pairs begin pulling up those bitlines which had been driven low by the write drive circuitry. As explained above, the load transistors Ld1/Ld1# through Ldn/Ldn# are relatively small and although they are capable of quickly pulling up a bitline with a small voltage imbalance after a read operation, they require a much longer time to pull up a bitline with a large voltage imbalance due to being discharged close to ground during a write operation. For this reason, the present invention incorporates an additional precharging scheme to help the load transistor more quickly precharge all the bitlines immediately following the end of a write mode.

Termination of the write mode causes the read-mode line to go low and the SRAM memory defaults to its read mode. Additionally, the post-write pulse line receives a low pulse coincident with the termination of the write mode. The read-mode line activates all equalization transistors Eq1–Eqn and thereby establishes the first precharging scheme by coupling together both bitlines in each complementary bitline pair.

The post-write pulse builds on this first precharge scheme to produce the third precharge scheme. It is to be noted that typically only a small fraction of all the complimentary bitline pairs are selected during a write operation, and only one bitline in each selected complementary bitline pair is discharged down close to ground level. Thus, a vast majority of the bitlines in a memory array already have a high voltage following the end of a write mode. Furthermore, each bitline has an intrinsic capacitance associated with it which is charged up to, or discharged down to, the voltage value of each respective bitline. Thus, at the end of a write mode most of the intrinsic capacitive pair C1/C1# to Cn/Cn# are fully charged up to Vcc and only those few intrinsic capacitances associated with a column selected for a write operation will be discharged. Eq1 couples together both bitlines in every complementary bitline pair and those complementary bitline pairs which where not selected for a write operation and have both bitlines at Vcc will not experience much transfer of charge. However, those complementary bitline pairs which were selected for a write operation and thus have one bitline at a high voltage and another at a low voltage will begin equalizing their potential. That is, the fully charged bitline will begin discharging into the low potential bitline until they both reach some equal value.

Those complementary bitlines which were not selected for a write operation and thus already had both bitlines at Vcc when there equalization transistors, i.e. Eq1, was activated responded to their equalization transistor by combining both of their intrinsic capacitive pair, i.e. C1/C1#, to form one larger equivalent capacitance. The post-write pulse takes advantage of this by activating all the switch transistors, $S_1-S_{n-1}$, and thereby coupling together all the complimentary bitline pairs in the memory array. Switch transistors $S_1-S_{n-1}$ may be n-type MOS transistors, but one implemented as p-type transistor is the preferred embodiment. Those complementary bitline pairs which were not selected for a write operation and thus had formed larger, charged capacitors due to their respective equalization transistor are thereby coupled together to create a much larger, fully charge, cumulative intrinsic capacitor which combines the intrinsic capacitances of the entire memory array. Switch transistors $S_1-S_{n-1}$ also couple this cumulative capacitor to those few bitlines which had been pulled low during the previous write operation. The large amount of charge stored in the cumulative capacitor quickly charges up those few low bitline to a voltage close to Vcc. Each bitline's respected pull-up load transistor Ld1/Ld1# to Ldn/Ldn# then finishes pulling them up to Vcc before a read operation is initiated.

For example, if only SRAM cell 1,1 is selected for a write operation, and a logic 1 is written to it, then $BL_1$ will be driven up to Vcc and $BL\#_1$ will be driven down toward ground. Since only column 1 is selected, the remaining bitlines $BL_2/BL\#_2$ to $BL_n/BL\#_n$ in the memory array are pull up to Vcc by their respective load transistors Ld2/Ld2# to Ldn/Ldn#.

The intrinsic capacitance associated with each bitline is charged or discharge to the same potential as the bitline. Thus C1# is discharged close to ground while C1 and C2/C2# to Cn/Cn# are charged up to Vcc. Following the end of the write operation, the read-mode line couples together capacitive pairs C1/C1# to Cn/Cn# in each complementary bitline pair. Furthermore, switch transistors $S_1$-$S_{n-1}$ couple col__1 to col__2 and col__2 to col__3 and so on throughout the memory such that all n complementary bitline pairs are coupled together. Since all the individual bitlines, intrinsic capacitances in the memory array are coupled in parallel, their individual capacitances, and hence their charge, are cumulative added. The cumulative net capacitance of the entire memory array quickly charges up bitline BL#$_1$ up toward Vcc, and pull-up load transistor Ld1# finishes bringing up BL#$_1$ to Vcc. Thus, by the time the post-write-pulse line is removed, all the bitlines have been raised close to Vcc and their respective voltage imbalances reduced such that the relatively small pull up load transistors Ld1/Ld1# to Ldn/Ldn# can quickly pull up all bitlines before a read operation is initiated without the need for an ATD circuit.

We claim:

1. A memory array of memory cells comprising:

multiple rows and at least four columns of memory cells;

at least one respective bitline per each of said columns of memory cells, said bitlines being divided into a first group and a second group, said first group of bitlines including at least 75% of all bitlines and further being coupled to a reference power rail having a first voltage potential, said second group of bitlines including the remaining bitlines not in said first group, said second group of bitlines having a second voltage potential different from said first voltage potential, each of said bitlines having an intrinsic capacitance; and switching means for selectively coupling together all of said bit lines in said first and second group of bitlines.

2. The memory of claim 1 wherein said switching means is responsive to the termination of a write operation and is effective for establishing an equivalent capacitance substantially similar to the sum of the intrinsic capacitances of all of said bit lines.

3. In a memory array having rows and columns of memory cells, the improvement comprising:

bitlines for selecting each of said columns of memory cells, each of said bitlines having an intrinsic capacitance; and switching means for selectively coupling together all of said bit lines in said memory array, said switching means including a plurality of switches, each of said switches being coupled between adjacent bit lines, each of said switches forming a closed connection in response to the termination a of write mode of operation.

4. The memory of claim 3 further comprising a plurality of switches coupling each of said bit lines to Vcc, said switches being permanently closed.

5. The memory of claim 4 wherein each of said switches is a pmos transistor in a constant on state.

6. The memory of claim 3 wherein said switching means includes a plurality of switches, each of said switches being coupled between adjacent bit lines.

7. The memory of claim 6 wherein a predetermined number of said switches are in a constantly closed connection in response to said memory not being in a write mode, a second predetermined number of said switches being placed in a closed connection for a predetermined period of time in response to said memory terminating said write mode.

8. The memory of claim 3 wherein said memory is a static random access memory and each of said columns of memory cells is selectable by means of a true and a complementary bitline pair, said switching means including a first set of switching means selectively coupling together each of said true bitline and complementary bitline pairs, said first switching means being closed in response to said memory cell not being in a write mode.

9. The memory of claim 8 wherein said switching means includes a second set of switching means selectively coupling the complementary bitline in a first column of memory cells to the true bitline in an adjacent column of memory cells.

10. The memory of claim 9 further having means for generating a signal pulse of predetermined duration in response to the termination of a write mode, said second set of switching means being closed in response to said signal pulse, said closing of said second switching means being effective for shorting together all true bitlines and complementary bitlines in said memory array for a period determined by said signal pulse.

11. The memory of claim 10 wherein said first set of switching means are pmos transistors and said second set of switching means are one of a pmos and nmos transistors.

12. The memory of claim 9 wherein each of said true bitline and complementary bitline is permanently coupled to Vcc through a pmos transistor in a constant on state.

13. An integrated silicon memory array comprising:

multiple rows and at least four columns of memory cells;

a plurality of true bitline and complementary bitline pairs for accessing each column of memory cells, each of said columns of memory cells being selected in response to the actuation of its respective true bitline and complementary bitline pair, the bitline pairs actuated for selecting their respective columns of memory cells forming a first group of bitline pairs, the remaining of said bitline pairs not actuated for selecting a respective column of memory cells forming a second group of bitline pairs, said second group of bitline pairs including at least 75% of all of said bitlines, all of said bitlines in said second group of bitline pairs further being coupled to a first voltage potential, each true and complimentary bitline pair within said first group of bitline pairs having one of either a second voltage potential and a third voltage potential, said second and third voltage potentials being respectively representative of a first and second logic state, said second voltage potential being substantially similar to said first voltage potential and said third voltage potential being different from said first voltage potential;

a plurality of switching means between adjacent true and complimentary bitlines, said switching means being effective for selectively coupling together all of said bitlines.

14. An integrated memory array comprising:

multiple rows and columns of memory cells;

a plurality of true bitline and complementary bitline pairs for accessing each column of memory cells;

a plurality of first switching means between adjacent columns of memory cells, each of said first switching means being effective for selectively coupling together the complementary bitline in one column of memory cells with the true bitline in an adjacent column of memory cells, and means for generating a pulse signal in response to the termination of a write mode of operation, each of said first switching means being closed in response to said pulse signal.

15. The memory array of claim 14 wherein each of said first switching means is one of an nmos and pmos transistor.

16. The memory array of claim 14 further having a second switching means associated with each column of memory cells and effective for selectively coupling together the columns's respective true bitline and complementary bitline pair; and a means for generating a read mode signal in response to said memory array being in a read mode, each of said second switching means being effective for coupling together its corresponding true bitline and complementary bitline pair in respond to said read mode signal.

17. The memory array of claim 16 wherein each of said second switching means is a pmos transistor.

18. The memory array of claim 16 wherein each of said true bitline and complementary bitline pair is further coupled to a power rail via a respective pmos transistor, said pmos transistor being in a permanent on state.

19. An SRAM memory comprising:

a plurality of memory cells arranged into an array of rows and columns;

a plurality of true bitline and complementary bitline pairs, each of said true bitline and complementary bitlines pairs being effective for selecting one of said columns of memory cells;

means for generating a read mode signal in response to said SRAM memory not being in a write mode;

means for generating a pulse signal in response to said SRAM memory terminating a write mode;

a first switching means for each of said true bitline and complementary bitline pairs, each of said first switching means selectively coupling together its corresponding true bitline and complementary bitline pair in response to said read mode signal; and a plurality of second switching means for coupling together adjacent columns of memory cells in response to said pulse signal, each of said second switching means being effective for coupling the complementary bitline in a first column of memory cells to the true bitline in an adjacent column of memory cells.

20. The memory of claim 19 wherein each of said second switching means is one of a pmos transistor and an nmos transistor.

21. The memory of claim 19 wherein each of said first switching means is a pmos transistor.

22. The memory of claim 19 wherein each of said true and complementary bitlines has an intrinsic capacitance, said first and second switching means further being effective for shorting together all of said true and complimentary bitlines for the duration of said pulse signal, said pulse signal thereby being effective for establishing an equivalent capacitance substantially similar to the sum of the intrinsic capacitances of all of said true and complementary bitlines.

23. The memory of claim 19 wherein each of said true and complementary bitlines is coupled to Vcc via a pmos transistor in a permanent on state.

24. An SRAM memory comprising:

a plurality of memory cells arranged into an array of rows and columns;

a plurality of true bitline and complementary bitline pairs, each of said true bitline and complementary bitlines pairs being effective for selecting one of said columns of memory cells;

a read mode line for generating an active signal in response to said memory not being in a write mode; and a first switching means for each true bitline and complementary bitline pair, said first switching means selectively coupling together its corresponding true bitline and complementary bitline pair in response to said active signal whereby the true bitline is maintained in constant electrical communication with its corresponding complimentary bitline whenever said memory is in read mode independent of the operation of a memory cell.

25. The memory of claim 24 wherein each of said first switching means is a pmos transistor.

26. The memory of claim 25 further having a third switching means constantly coupling each of said true bitlines and complimentary bitlines to a power rail.

27. The memory of claim 26 wherein each of said third switching means is a pmos transistor in a constant on state.

28. The memory of claim 24 further defined by a plurality of second switching means, each of said second switching means being effective for selectively coupling together the complementary bitline in one column of memory cells with the true bitline in an adjacent column of memory cells.

29. The memory of claim 28 wherein each of said second switching means is one of a pmos transistor and an nmos transistor.

30. The memory of claim 28 further having means for generating a pulse signal in response to the termination of a write mode, said second switching means being responsive to said pulse signal.

31. The memory of claim 30 wherein said SRAM memory defaults to said read mode at the termination of a write mode, whereby all of said first and second switching means are simultaneously closed for the duration of said pulse signal, said pulse signal thereby being effective for shorting together all true bitlines and complimentary bitlines in said memory array.

* * * * *